(12) United States Patent
Kaneko et al.

(10) Patent No.: US 9,516,769 B2
(45) Date of Patent: Dec. 6, 2016

(54) ELECTRONIC CONTROL DEVICE

(71) Applicant: Hitachi Automotive Systems, Ltd., Hitachinaka-shi, Ibaraki (JP)

(72) Inventors: Susumu Kaneko, Isesaki (JP); Kazuaki Nagashima, Kiryu (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/656,939

(22) Filed: Mar. 13, 2015

(65) Prior Publication Data

US 2015/0271933 A1   Sep. 24, 2015

(30) Foreign Application Priority Data

Mar. 18, 2014  (JP) ................. 2014-054263

(51) Int. Cl.
| | | |
|---|---|---|
| *H05K 1/02* | (2006.01) | |
| *H05K 5/02* | (2006.01) | |
| *H05K 7/14* | (2006.01) | |
| *H05K 7/20* | (2006.01) | |

(52) U.S. Cl.
CPC .......... *H05K 5/0213* (2013.01); *H05K 1/0203* (2013.01); *H05K 7/1427* (2013.01); *H05K 7/20863* (2013.01)

(58) Field of Classification Search
CPC .............. H05K 5/02; H05K 7/14; H05K 1/02; H05K 5/0213; H05K 1/0203; H05K 7/1427; H05K 5/00; H05K 7/02; H05K 7/06; H05K 7/10; B65D 51/16; H01R 13/46; F02D 1/00
USPC ................... 361/679.46, 688, 690, 692, 694, 715,361/760; 454/184, 254, 275; 174/50, 50.02, 174/17 VA, 17 R, 52.1, 52.4, 535, 547; 312/223.2, 236

See application file for complete search history.

(56) References Cited

U.S. PATENT DOCUMENTS

| | | | | |
|---|---|---|---|---|
| 6,506,110 B1 * | 1/2003 | Borisch | ................ | H05K 5/0213 174/17 VA |
| 7,189,918 B2 * | 3/2007 | Sakata | ................ | B60R 16/0239 174/17 VA |
| 7,396,391 B2 * | 7/2008 | Waida | .................. | H05K 5/0213 55/385.1 |
| 7,907,410 B2 * | 3/2011 | Martin | .................. | H01L 23/367 165/185 |
| 8,437,134 B2 * | 5/2013 | Sarginger | ............ | B60R 16/0239 174/17 VA |
| 8,670,234 B2 * | 3/2014 | Nakano | .................. | H02K 11/33 361/690 |
| 8,699,231 B2 * | 4/2014 | Shinoda | ............... | H05K 5/0047 174/520 |

(Continued)

FOREIGN PATENT DOCUMENTS

| | | | | |
|---|---|---|---|---|
| EP | 002435810 B1 * | 1/2014 | ......... | G01L 19/0636 |
| JP | 2002134939 A * | 5/2002 | ............... | H05K 5/02 |
| JP | 2002-353675 A | 12/2002 | | |

*Primary Examiner* — Michail V Datskovskiy
(74) *Attorney, Agent, or Firm* — Crowell & Moring LLP

(57) ABSTRACT

An electronic control device, comprising: a circuit board on which an electronic component having a heat generating characteristic is mounted; a resin made cabinet housing the circuit board; and a ventilation passage whose one end is opened to an inside of the cabinet and whose other end is opened to an outside of the cabinet to communicate between the inside of the cabinet and the outside of the cabinet, wherein the one end of the ventilation passage is opened to the electronic component having the heat generating characteristic and a standing wall is formed along an outer peripheral edge of the one end opening.

6 Claims, 8 Drawing Sheets

(56) References Cited

U.S. PATENT DOCUMENTS

2005/0207114 A1\* 9/2005 Gall ............... H05K 5/0047
361/690
2013/0010426 A1\* 1/2013 Nakano ............ H02K 11/33
361/690

\* cited by examiner

ELECTRONIC CONTROL DEVICE

BACKGROUND OF THE INVENTION (1) Field of the Invention

The present invention relates to an electronic control device mounted in, for example, an automotive vehicle or so forth.

(2) Description of Related Art

A Japanese Patent Application First Publication No. 2002-353675 published on Dec. 6, 2002 exemplifies a previously proposed structure of an electronic control device in which a breathing hole communicating between an outside of a cabinet and an inside of the cabinet is arranged at a proximity of a heat generating element (an electronic component having a heat generating characteristic) in order to prevent an excessive rise in a temperature of the cabinet housing the heat generating element.

In such a previously proposed structure of the electronic control device as described in the above-described Japanese Patent Application Publication, even if the temperature around the heat generating element is raised, heated air from the breathing hole located at the proximity of the heat generating element is speedily exhausted and the temperature of the cabinet is not excessively raised.

SUMMARY OF THE INVENTION

However, although, in the above-described Japanese Patent Application Publication, a distance between the breathing hole and the heat generating element is shortened, there is a possibility that a stream of air introduced from the breathing hole is scattered until it arrives at the heat generating element. Therefore, there is a possibility that the heat generating element cannot efficiently be cooled by means of air introduced from the breathing hole.

It is, therefore, an object of the present invention to provide an electronic control device which can efficiently cool the heat generating element (the component having the heat generating characteristic).

According to one aspect of the present invention, there is provided with an electronic control device, comprising: a circuit board on which an electronic component having a heat generating characteristic is mounted; a resin made cabinet housing the circuit board; and a ventilation passage whose one end is opened to an inside of the cabinet and whose other end is opened to an outside of the cabinet to communicate between the inside of the cabinet and the outside of the cabinet, wherein the one end of the ventilation passage is opened to the electronic component having the heat generating characteristic and a standing wall is formed along an outer peripheral edge of the one end opening.

According to the present invention, a dispersion (scattering) of an air stream blown out into the cabinet from one end opening of the ventilation passage is suppressed due to a presence of the standing wall. Therefore, it becomes possible to efficiently cool the electronic component having the heat generating characteristic and opposed to the one end opening of the ventilation passage by means of air introduced from the ventilation passage.

DETAILED DESCRIPTION OF THE INVENTION

Figure 1:
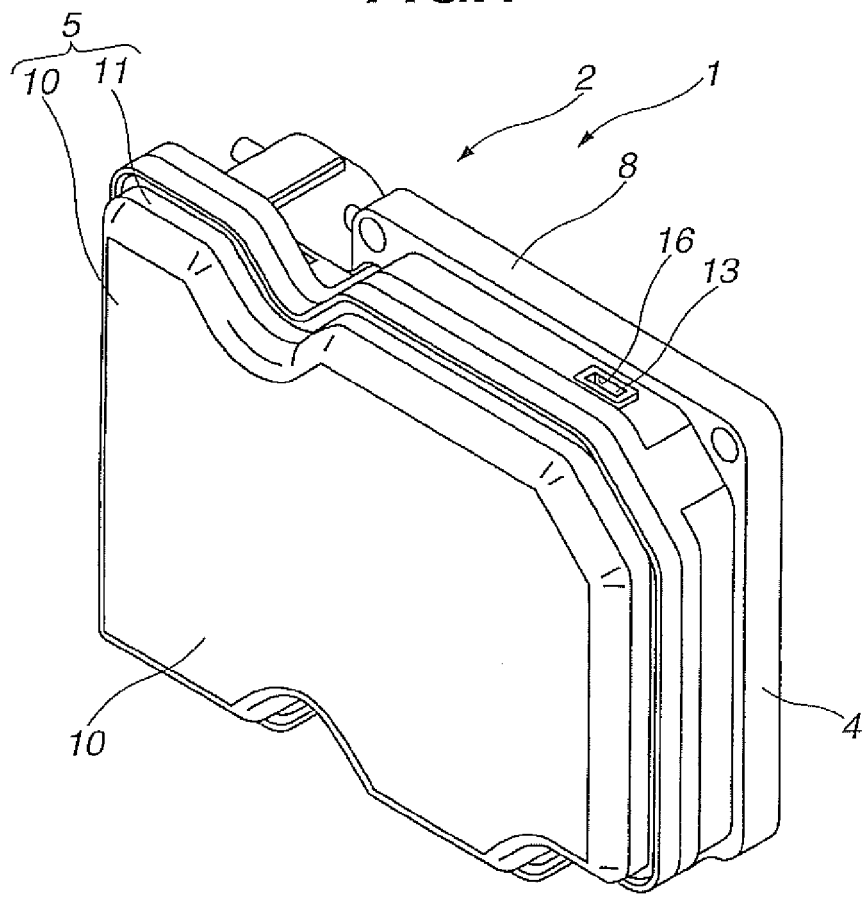
FIG. 1 is a perspective view of a whole of an electronic control device according to the present invention.
Figure 2:
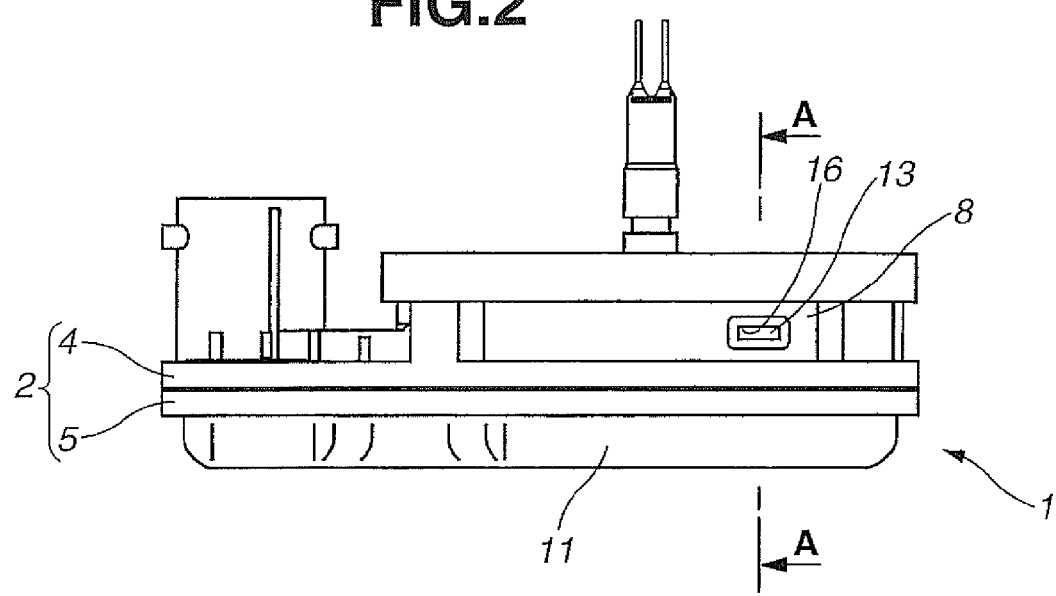
FIG. 2 is a front view of the electronic control device according to the present invention.
Figure 3:
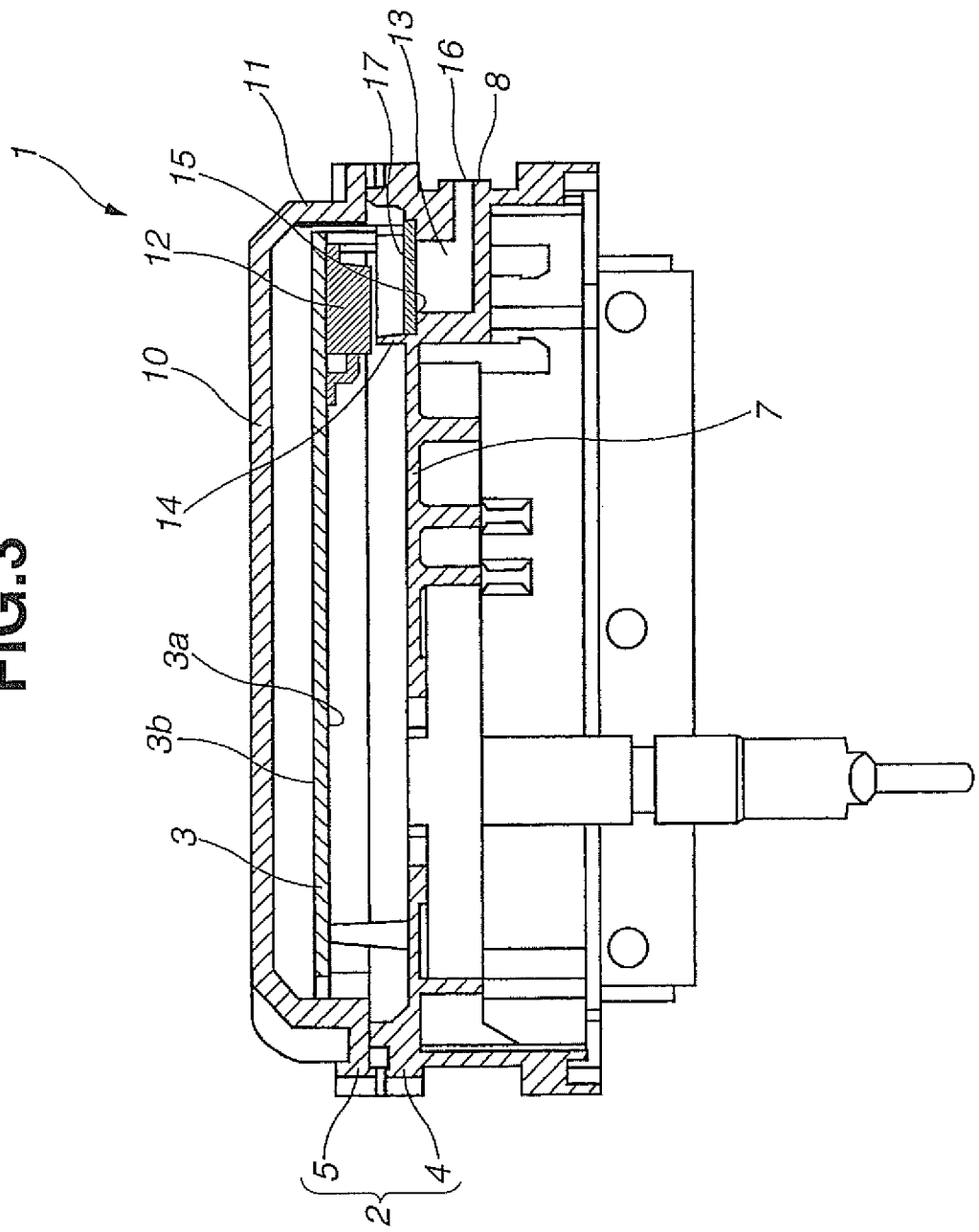
FIG. 3 is a cross sectional view of the electronic control device cut away along a line A-A in FIG. 2.
Figure 4:
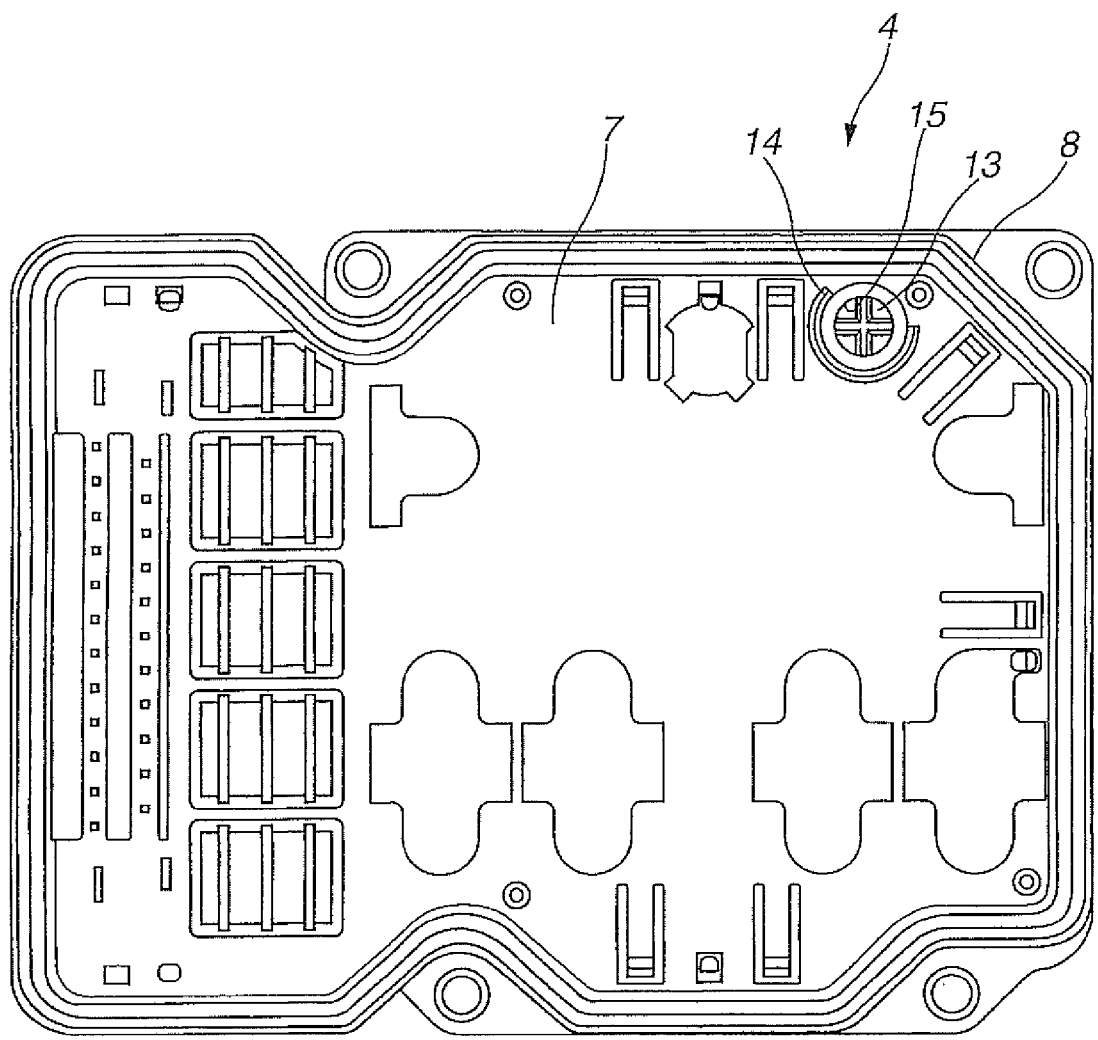
FIG. 4 is a plan view of a case member constituting a cabinet of the electronic control device according to the present invention.
Figure 5:
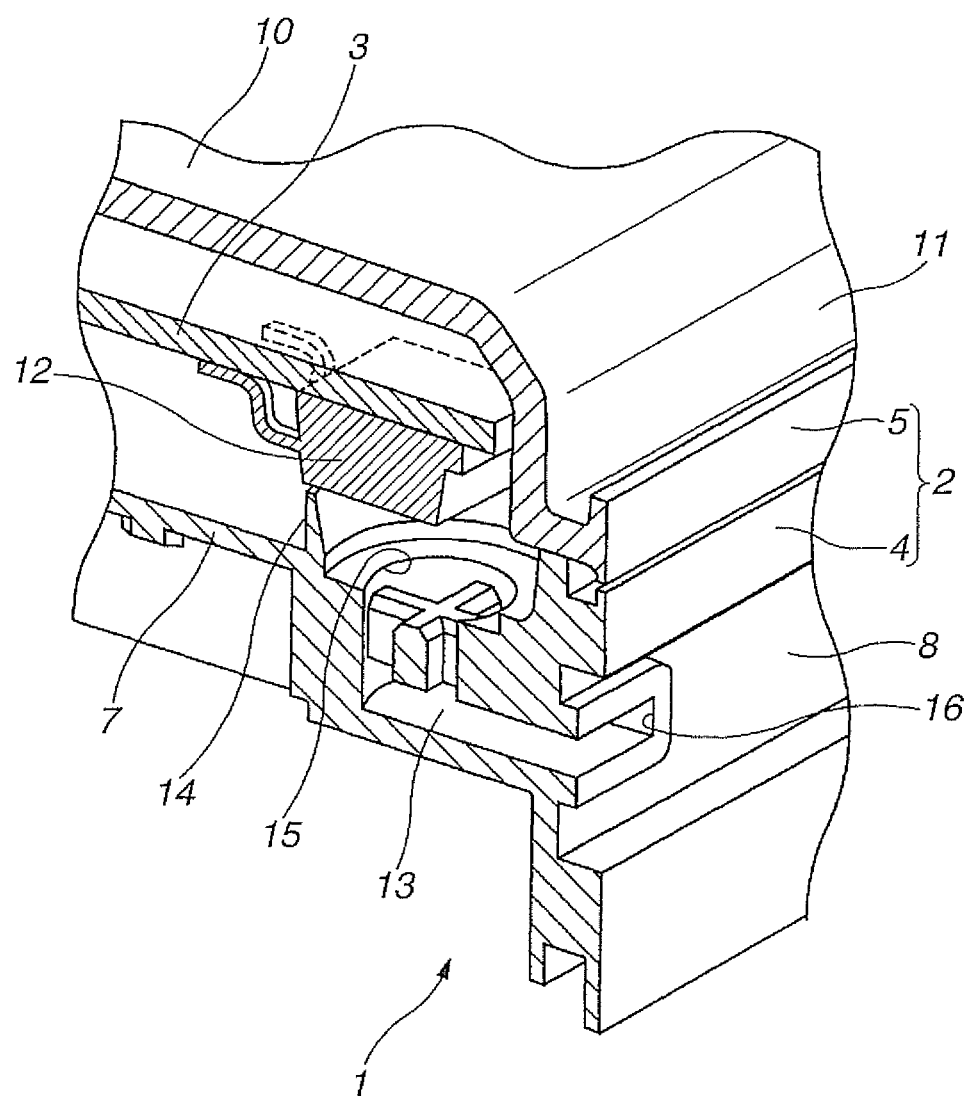
FIG. 5 is an explanatory view representing an enlarged view of an essential part of the electronic control device according to the present invention.
Figure 6:
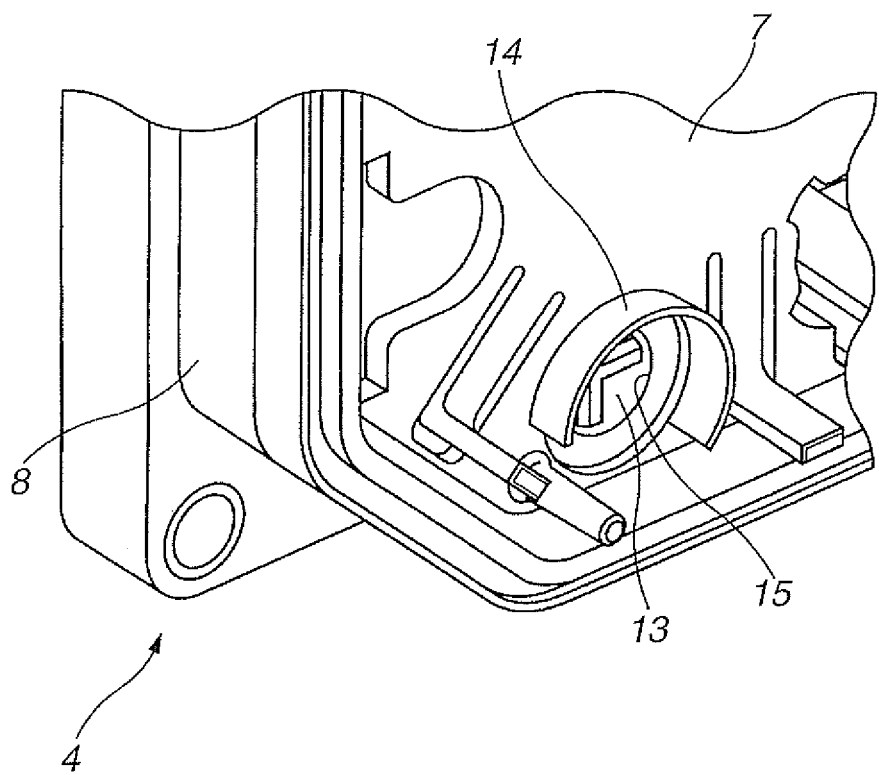
FIG. 6 is an explanatory view representing an enlarged view of an essential part of a case member constituting a cabinet of the electronic control device according to the present invention.

Hereinafter, preferred embodiments of an electronic control device according to the present invention will be described in details on a basis of the accompanied drawings. FIGS. 1 through 6 are explanatory views diagrammatically representing a rough structure of electronic control device 1 according to the present invention. FIG. 1 shows a whole perspective view, FIG. 2 shows a front view, FIG. 3 shows a cross sectional view cut away along a line A-A in FIG. 2, FIG. 4 shows a plan view of a case member 4 constituting a cabinet 2 of the electronic control device, and FIGS. 5 and 6 shows explanatory views of the enlarged essential part. It should be noted that, in FIGS. 5 and 6, a filter member 17 (the detailed explanation thereof will be described later) is omitted for an explanation convenience.

Electronic control device 1 is mounted in an automotive vehicle and is used for control(s) of an engine, a transmission, a brake, and/or so forth. Electronic control device 1 has a cabinet having an outer profile of a substantially rectangular parallelepiped shape. A circuit board 3 is housed within cabinet 2. On circuit board 3, an electronic component having a heat generating characteristic such as an FET (field effect transistor), a MOSFET (metal-oxide semiconductor field effect transistor), a coil, and so forth is mounted.

Cabinet 2 includes a case member 4 holding circuit board 3 and a cover member 5 covering circuit board 3 held by case member 4. Each of case member 4 and cover member 5 is made of a resin material. Mutual outer peripheral edges of case member 4 and cover member 5 are joined to each other over a whole periphery through a vibration welding.

Case member 4 is made of die forming and has a substantially rectangular dish shape. Case member 4 includes: a bottom wall 7 opposed to one electronic component (part) mounting surface 3a of circuit board 3; and a side wall 8 substantially orthogonal to bottom wall 7. Cover member 5 is made of die forming and has a substantially rectangular dish shape. Cover member 5 includes: a bottom wall 10 opposed to the other electric component (part)

mounting surface 3b of circuit board 3; and a side wall 11 substantially orthogonal to bottom wall 10.

Circuit board 3 is of a substantially rectangular plate shape and fixed to case member 4 by means of screws (not shown). Circuit board 3 is, for example, made of a glass epoxy resin or so forth. On an outer peripheral edge of one electronic component (part) mounting surface 3a of circuit board 3, MOSFET 12 as an electronic component having a heat generating characteristic (hereinafter, referred to as a heat generating component 12) is mounted. This heat generating component 12 is closed to one side walls of case member 4 and cover member 5 which serve as one side wall of cabinet 2.

Then, case member 4 constituting cabinet 2 is provided with: a ventilation passage 13 which communicates between an inside of this cabinet 2 and an outside of this cabinet 2; and a standing wall 14 which guides air introduced from ventilation passage 13 to heat generating component 12.

Then, ventilation passage 13 is formed on case member 4 to have one end opening 15 which opens to bottom wall 7 of case member 4 and to have the other end opening 16 which opens to an outer side surface of a side wall 8 of case member 4. Ventilation passage 13 is, as a whole, a hole bent in a substantially letter L shape and formed at the same time as the die forming of case member 4.

Ventilation passage 13 has one end side orthogonal to bottom wall 7 of case member 7 and has the other end orthogonal to side wall 8 of case member 4. One end opening 15 of ventilation passage 13 is a circular opening and is formed at a position opposed to a tip of heat generating component 12. A circular filter member 17 having a ventilation characteristic (breathability) and a waterproof characteristic is attached onto one end opening 15 of ventilation passage 13.

Standing wall 14 is formed along an outer peripheral edge of one opening end 15 of ventilation passage 13. Standing wall 14 in this embodiment encloses the outer peripheral edge of one end opening 15 in a substantially letter C shape and is projected toward heat generating component 12. In other words, standing wall 14 in this embodiment is projected and formed to provide a wall of a substantially letter C shape cross section in which a part of a cylindrical wall is cut out along an axial direction of the cylindrical wall. A portion of the outer peripheral edge of the one end opening 15 of ventilation passage 13 which is not enclosed by standing wall 14 is located at one side wall of case member 4 and cover member 5 which provide the one side wall of cabinet 2.

In electronic control device 1 according to the present invention, as described above, standing wall 14 suppresses a scattering of the air stream blown out from one end opening 15 of ventilation passage 13 into cabinet 2. Thus, it becomes possible to efficiently cool heat generating component 12 opposed to one end opening 15 of ventilation passage 13 by means of air introduced from ventilation passage 13 and, even if a quantity of air blown out from one end opening 15 of ventilation passage 13 into cabinet 2 is small (minor), the cooling effect of heat generating component 12 opposed to one end opening 15 of ventilation passage 13 can relatively be increased.

In addition, standing wall 14 encloses the outer peripheral edge of one end opening 15 of ventilation passage 13 in the substantially letter C shape. Hence, becomes possible to supply air to heat generating component 12 while air outside of standing wall 14 from a part of the opening end which is not enclosed by standing wall 14 is involved. As compared with a case where the standing wall is cylindrical, a flow quantity of air flowing toward heat generating component 12 opposed to one end opening 15 of ventilation passage 13 can be increased.

Since filter member 17 is arranged on one end opening 15 of ventilation passage 13 opened to bottom wall of case member 4, a passage length from other end opening 16 of ventilation passage 13 to filter member 17 can relatively be set to be short. Even if water is invaded from an external within ventilation passage 13, water is difficult to be accumulated within ventilation passage 13 and a discharge of water can be facilitated.

It should be noted that it is possible for standing wall 14 to be disposed on a whole periphery of the outer peripheral edge of one end opening 15 of ventilation passage 13. That is to say, standing wall 14 may be formed in the cylindrical shape.

Hereinafter, another preferred embodiment of the electronic control device according to the present invention will be described. The same essential elements as those described in the first embodiment designate the same reference numerals and the description of these elements will be omitted herein.

Figure 7:
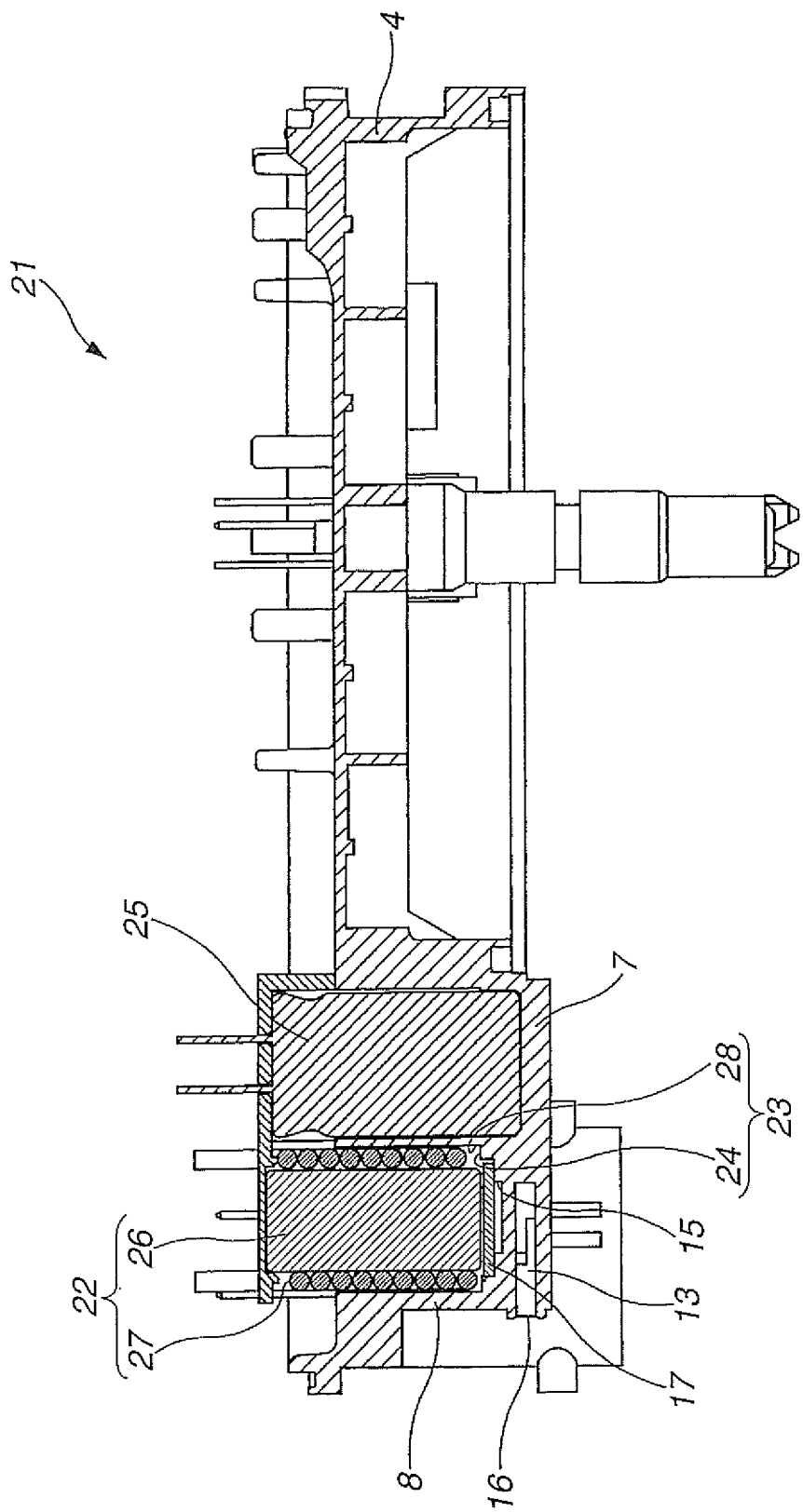
FIG. 7 is a cross sectional view of the essential part of the electronic control device in a second preferred embodiment according to the present invention.
Figure 8:
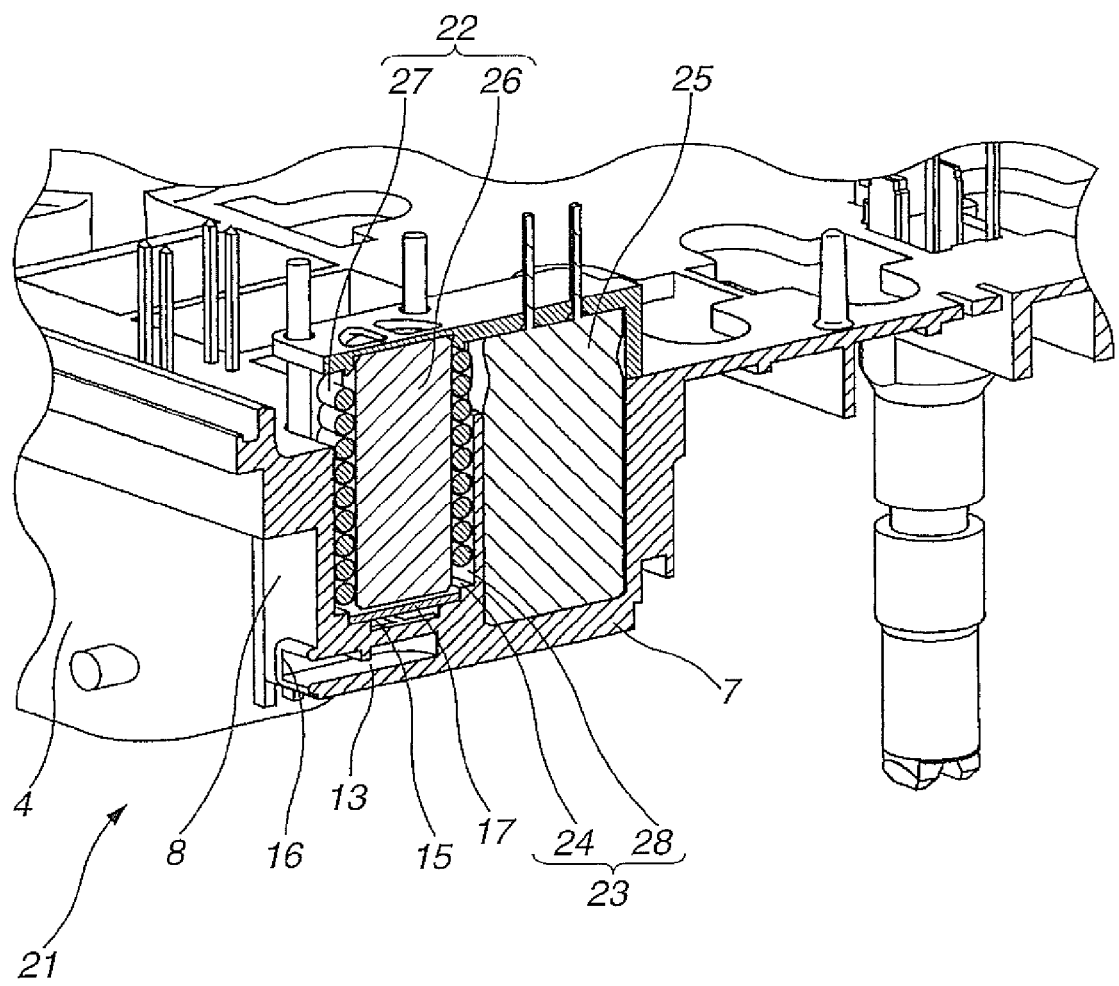
FIG. 8 is an explanatory view representing an enlarged view of the essential part of the electronic control device in the second preferred embodiment according to the present invention.

The structure in which air is introduced to the electronic component having the heat generating characteristic within cabinet 2 is not limited to standing wall 14 having the above-described shape. For example, it is possible to form electronic control device 21 of a second preferred embodiment as shown in FIGS. 7 and 8.

Electronic control device 21 in the second preferred embodiment is substantially the same as electronic control device 1 of the first embodiment. However, in the second embodiment, a coil 22 which is the electronic component having the heat generating characteristic is housed within a component housing recess section 23 formed on bottom wall 7 of case member 4 constituting cabinet 2 and one end opening 15 of ventilation passage 13 is formed on a bottom surface 24 of this component housing recess section 23.

Coil 22 is mounted on the circuit board together with a capacitor 25 adjacent to coil 22. Coil 22 substantially includes: an iron core 26; and a winding 27 wound on an outer periphery of iron core 26.

Component housing recess section 23 is set in order for its inner space to be larger than an outer dimension of coil 22. In other words, component housing recess section 23 is set to be a state in which a predetermined gap is provided for an inner peripheral wall 28 not to be contacted with winding 27 of coil 22 when coil 22 is housed within component housing recess section 23.

In electronic control device 21 of the second embodiment as described above, an inner peripheral wall 28 of component housing recess section 23 corresponds to standing wall 14 in the first embodiment. In electronic control device 21 in the second preferred embodiment, air introduced from the external via ventilation passage 13 is always passed through a space between coil 22 and inner peripheral wall 28 of component housing recess section 23. Therefore, air blown out from one end opening 15 of ventilation passage 13 within cabinet 2 is contacted on coil 22 without scattering. Then, coil 22 can efficiently be cooled according to air introduced from ventilation passage 13. In addition, even if the quantity of air blown out from one end opening 15 of ventilation passage 13 into component housing recess section 23 is small (minor), the cooling effect of coil 22 can relatively be increased.

Then, since one end opening 15 of ventilation passage 13 is formed on bottom surface 24 of component housing recess section 23, a deviation of the air stream flowing around coil 22 is reduced and a surrounding of coil 22 can uniformly be cooled.

It should be noted that since, in the second embodiment, filter member 17 is arranged on one end opening 15 of ventilation passage 13, in the same way as described in the first embodiment, water is difficult to be accumulated in ventilation passage 13 and the discharge of water can be facilitated.

Figure 9:
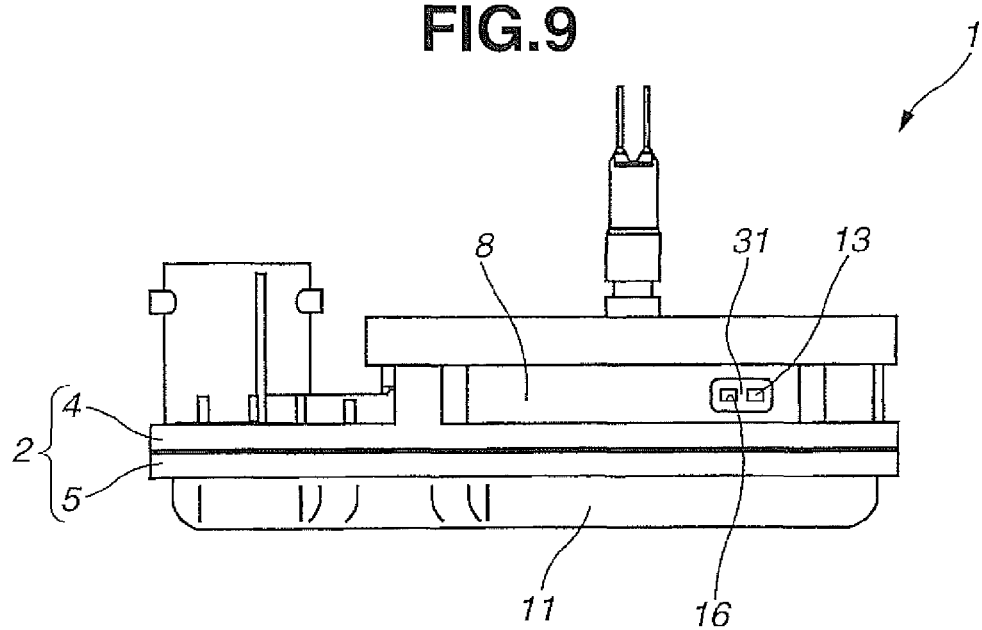
FIG. 9 is a front view of the electronic control device in another preferred embodiment according to the present invention.
Figure 10:
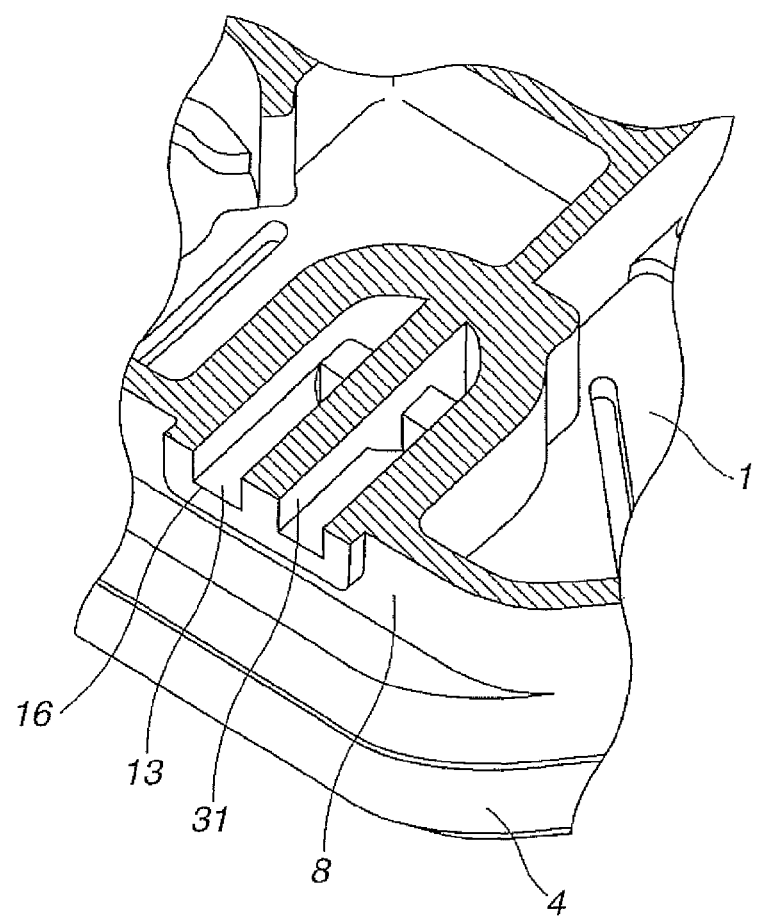
FIG. 10 is an explanatory view representing an enlarged view of the essential part of the case member constituting the cabinet of the electronic control device in the other preferred embodiment according to the present invention.

In the above-described first and second embodiments, a partitioning wall 31 may be disposed which divides ventilation passage 13 along a ventilation direction of air as shown in FIGS. 9 and 10 when ventilation passage 13 is formed in cabinet 2. In the illustrated example, partitioning wall 31 is formed on other end opening 16 of ventilation passage 13. It should be noted that FIG. 10 is an explanatory view representing an enlarged view of a cross section of case member 4 along with a plane in parallel to bottom wall 7 of case member 4 passing through other end opening 16 of ventilation passage 13.

As described above, if partitioning wall 31 is installed within ventilation passage 13, a disturbance of air convection within ventilation passage 13 is suppressed and entrance and exit of air can smoothly be carried out.

This application is based on a prior Japanese Patent Application No. 2014-054263 filed in Japan on Mar. 18, 2014. The entire contents of this Japanese Patent Application No. 2014-054263 are hereby incorporated by reference. Although the invention has been described above by reference to certain embodiments of the invention, the invention is not limited to the embodiment described above. Modifications and variations of the embodiments described above will occur to those skilled in the art in light of the above teachings. The scope of the invention is defined with reference to the following claims.

What is claimed is:

1. An electronic control device, comprising:
   a circuit board on which an electronic component having a heat generating characteristic is mounted;
   a resin made cabinet housing the circuit board; and
   a ventilation passage whose one end is opened to an inside of the cabinet and whose other end is opened to an outside of the cabinet to communicate between the inside of the cabinet and the outside of the cabinet, wherein the one end of the ventilation passage is opened to the electronic component having the heat generating characteristic, a standing wall stands up from a bottom wall having a one end opening along an outer peripheral edge of the one end opening, and a tip of the standing wall is closer to the circuit board than the one end opening.

2. The electronic control device as claimed in claim 1, wherein the electronic control device further comprises a filter member having a ventilation characteristic and a waterproof characteristic and arranged to cover the one end opening of the ventilation passage and the standing wall is disposed toward the circuit board side more than the filter member.

3. The electronic control device as claimed in claim 1, wherein the standing wall is formed to enclose an outer peripheral edge of the one end opening of the ventilation passage in a form of a letter C shape.

4. The electronic control device as claimed in claim 1, wherein the cabinet includes a component housing recess section opened toward a mounting surface of the circuit board and housing the electronic component having the heat generating characteristic, the one end opening of the ventilation passage is formed on a bottom surface of the component recess housing section, and an inner peripheral wall of the component housing recess section provides the standing wall.

5. The electronic control device as claimed in claim 1, wherein a partitioning wall is formed in the ventilation passage which divides an inside of the ventilation passage along a ventilation direction of air.

6. The electronic control device as claimed in claim 1, wherein openings of the one end and the other end of the ventilation passage are substantially perpendicular to each other.

* * * * *